(12) United States Patent
Hyozo et al.

(10) Patent No.: US 6,275,055 B1
(45) Date of Patent: Aug. 14, 2001

(54) SEMICONDUCTOR INTEGRATED CIRCUIT

(75) Inventors: Masahiko Hyozo; Katsushi Asahina, both of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/286,291

(22) Filed: Apr. 6, 1999

(30) Foreign Application Priority Data

Dec. 1, 1998 (JP) ................................................ 10-341837

(51) Int. Cl.$^7$ .................................................. G01R 31/28
(52) U.S. Cl. .................... 324/755; 324/763; 324/158.1; 714/728; 371/22.5
(58) Field of Search ................................... 324/755, 765, 324/754, 158.1, 73.1, 763; 714/727, 728; 371/22.5, 12.5, 22.4

(56) References Cited

U.S. PATENT DOCUMENTS

| | | | |
|---|---|---|---|
| 5,640,102 | * | 6/1997 | Sato ..................................... 324/755 |
| 5,701,306 | * | 12/1997 | Arai ..................................... 371/22.1 |
| 6,076,178 | * | 6/2000 | Komoda ............................... 714/712 |

FOREIGN PATENT DOCUMENTS

| | | |
|---|---|---|
| 5-256910 | 10/1993 | (JP) . |
| 6-300814 | 10/1994 | (JP) . |
| 10-48289 | 2/1998 | (JP) . |

* cited by examiner

*Primary Examiner*—Safet Metjahic
*Assistant Examiner*—Jimmy Nguyen
(74) *Attorney, Agent, or Firm*—Burns, Doane, Swecker & Mathis, LLP

(57) ABSTRACT

A semiconductor integrated circuit, in which an input buffer, an output buffer, and an input/output buffer connected to signal pins respectively each as an object for a DC test are connected to a single DC test pin through discretely provided switches, all the switches are OFF in an ordinary state, and when the DC test is to be performed, the switches are successively turned ON one by one in a state where the DC test pin is connected to an LSI tester. With the operation, various types of DC test such as a pin contest, an input leak test and an output voltage test can be performed by using a LSI tester having a smaller number of pins than a number of pins in an LSI without requiring a connection such that the signal pins as objects for the test are in one-to-one correspondence with the pin electronics in the LSI tester.

14 Claims, 13 Drawing Sheets

US 6,275,055 B1

SEMICONDUCTOR INTEGRATED CIRCUIT

FIELD OF THE INVENTION

The present invention relates to a semiconductor integrated circuit to which a DC test for checking of leakage from input pins or of output voltage level can be performed by using a tester having a smaller number of pins than a number of pins in a semiconductor integrated circuit.

BACKGROUND OF THE INVENTION

A test for a semiconductor integrated circuit (described LSI hereinafter) is largely classified to a function test for checking a logical function for the circuit and a DC test for checking of leakage from an input pin or of output voltage level. Those tests are generally performed by using a commercially available tester (described an LSI tester hereinafter).

FIG. 11 is a simulated view showing a connectional relation between a conventional type of LSI and LSI tester. The LSI tester 1 comprises pin electronics 11 enabling generation and monitoring of signal waveforms for performing a function test, a DC measuring unit 12 provided separately from the pin electronics 11 for DC measurement, and relays 14 provided at midpoint of signal lines 13 respectively.

When a function test is performed, the relays 14 are switched to the pin electronics 11, by which the signal pins 21 of the LSI 2 are connected to the pin electronics 11 of the LSI tester 1 through the relays 14 so that the signal pins 21 are in one-to-one correspondence with the pin electronics 11.

On the other hand, when a DC test is performed, the relays 14 are successively switched to the DC measuring unit 2 one after another. With this operation, the signal pins 21 of the LSI 2 are successively connected to the DC measuring unit 12 through each relay 14 switched to the DC measuring unit 12. FIG. 11 shows a state where the topmost signal pin 21 of the LSI 2 is connected to the DC measuring unit 12.

Description is made herein for the DC test. The DC test has three types of tests: a pin contest for checking connection between the LSI tester and LSI, an input leak test for checking whether there is failure as current leakage to an input pin of the LSI, and an output voltage test for checking a voltage level output from an output pin of the LSI.

FIG. 12 is a view showing an outline of the pin contest, and the reference numerals D1 and D2 show protective diodes provided in the power unit VDD and a ground GND of the signal pin section in the LSI 2 respectively. In the pin contest a voltage V1 being generated in the protective diode D1 when a current I1 is supplied to the LSI 2 through the signal pin 21 from the DC measuring unit 12 of the LSI tester 1 and a voltage V2 being generated in the protective diode D2 when a current I2 is taken out from the LSI 2 is measured, and connection between the LSI tester 1 and LSI 2 are checked according to those measured values.

FIG. 13 is a view showing an outline of the input leak test. The input leak test provides a potential at a relatively lower level (corresponding to "0") or at a relatively higher level (corresponding to "1") to the signal pin 21 of the LSI 2 using the DC measuring unit 12, and checks the current flowing at that point of time. When there is resistive short-circuiting failure to the power unit VDD (shown as resistance R1 in FIG. 13), a current I3 flows into the LSI tester 1 when "0" is provided to the signal pin 21, and when there is resistive short-circuiting failure to the ground GND (shown as resistance R2 in FIG. 13), a current I4 flows into the LSI 2 when "1" is provided to the signal pin.

FIG. 14 is a view showing an outline of the output voltage test, and in this test, a current I5 is drawn out to the LSI tester 1 when the voltage output from the signal pin is "1", on the other hand, when voltage output from the signal pin is "0", a voltage level is checked while a current I6 is provided to the LSI 2. Assuming that resistance of the gate G1 is Rp when it becomes ON when the output voltage is "1", the voltage when this gate G1 is ON can be expressed with the following expression (1), and assuming that resistance of the gate G2 is Rn when it becomes ON when the output voltage is "0", the voltage when this gate G2 is ON can be expressed with the following expression (2).

$$\text{Voltage}=\text{VDD}-\text{Rp}\times|\text{I5}| \quad (1)$$

$$\text{Voltage}=\text{Rn}\times|\text{I6}| \quad (2)$$

The output voltage test checks whether the values of Rp and Rn according to the expressions (1) and (2) are within a normal range or not.

The scale of integration in LSI is dramatically becoming larger in recent years, and in association with that number of signal pins is becoming larger, and therefore there has arisen a case where the number of signal pins of the LSI exceeds the number of pin electronics prepared for the existing LSI tester. In that case, in the conventional type of LSI tester, there may occur a problem that some signal pins in the LSI can not be connected to the LSI tester, so that it is difficult to test the LSI, but it is possible to perform the function test by incorporating self-test capabilities inside the LSI in place of the conventional method using the LSI tester. In this case, only some signal pins are sufficient for inputting a clock signal and a control signal into the LSI from the outside.

As for the DC test, however, there is no solution so far for a case where a number of signal pins of LSI is larger than a number of pin electronics of an LSI tester, and therefore the DC test can not be performed.

SUMMARY OF THE INVENTION

It is an object of the present invention to obtain, for solving the problems described above, a LSI (semiconductor integrated circuit) which can be DC tested using a LSI tester having a smaller number of pins than a number of signal pins in the LSI.

With the present invention, a LSI to which a DC test is performed by a tester connected to the outside thereof has a plurality of switches successively becoming ON at the time of DC testing in signal paths between a plurality of internal circuits for signal input/output and a signal pin for a DC test respectively, and by turning ON each switch, the plurality of internal circuits are successively connected to the signal pin for a DC test one by one when the DC test is performed.

With the present invention, an internal circuit comprises protection diodes and an input buffer circuit or an output buffer circuit connected thereto.

With the present invention, a switch comprises a transfer gate.

With the present invention, a register is incorporated therein as a circuit for generating signals for successively turning ON the switches, and the register shifts an ON signal of the switches and successively outputs to each of the switches.

With the present invention, a current path with parasitic diodes is cut off by an N-channel transistor when the DC test is performed.

Other objects and features of this invention will become apparent from the following description with reference to the accompanying drawings.

DESCRIPTION OF THE PREFERRED EMBODIMENTS

Detailed description is made hereinafter for preferred embodiments of the semiconductor integrated circuit according to the present invention with reference to the related drawings.

Figure 1:
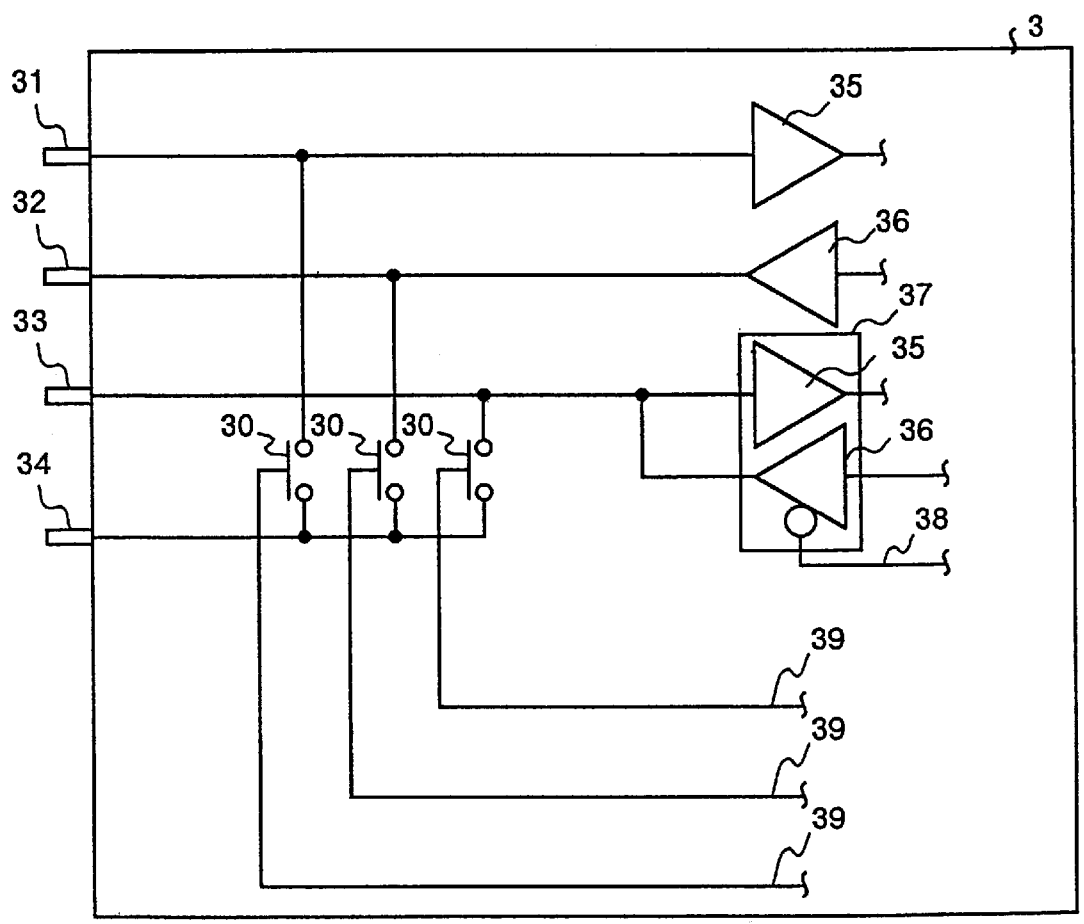
FIG. 1 is a simulated view showing an example of the configuration of the LSI according to Embodiment 1 of the present invention.

FIG. 1 is a simulated view showing an example of the configuration of the LSI according to Embodiment 1 of the present invention. In FIG. 1, each one of input pins 31, output pins 32, and input/output pins 33 in signal pins in LSI 3 is shown to avoid the figure becoming complicated, the input pins, output pins and input/output pins other than these pins are omitted herein. The LSI 3 comprises a signal pin (described as a pin for a DC test hereinafter) 34 connected to a DC measuring unit 12 (Refer to FIG. 2) in the LSI tester 1 not shown in the figure when a DC test is performed in addition to the input pin 31, output pin 32, and input/output pin 33.

The input pin 31 is connected to an input buffer 35 in the LSI 3. The output pin 32 is connected to an output buffer 36 in the LSI 3. The input/output pin 33 is connected to an input/output buffer 37 comprising the input buffer 35 and output buffer 36 in the LSI 3. Switching of input and output to and from this input/output buffer 37 is performed with an I/O switch signal provided by a control section not shown in the figure through a signal line 38.

The DC test pin 34 is connected to the input buffer 35, output buffer 36 and input/output buffer 37 through switches 30 discretely provided therein. Namely, all the input buffers 35, output buffers 36 and input/output buffer 37 in the LSI 3 are programmed to be connected to the DC test pin 34 by turning ON each of the switches 30 respectively. Accordingly, all the input buffers 35, output buffers 36 and input/output buffer 37 in the LSI 3 are disconnected from the DC test pin 34 when the switch 30 becomes OFF.

The switches 30 are generally OFF, and they are successively turned ON one by one when the DC test is performed. Switching ON/OFF of each of the switches 30 is carried out with a open/close signal provided by the signal generating circuit not shown in the figure through each signal line 39.

The DC test pin 34 may be a signal pin dedicated for use only when the DC test is performed, or may be combinely used as a signal pin for signal transaction with the outside or as a signal pin connected to the power unit VDD and the ground GND when the LSI 3 is mounted on a circuit board to be used (namely, on its ordinary use). When the DC test pin 34 is used combinely as a signal pin with its ordinary use, a selector is provided between the DC test pin 34 and the switch 30, with which the signal path connected to the DC test pin 34 may be switched for DC testing and for ordinary use.

Figure 2:
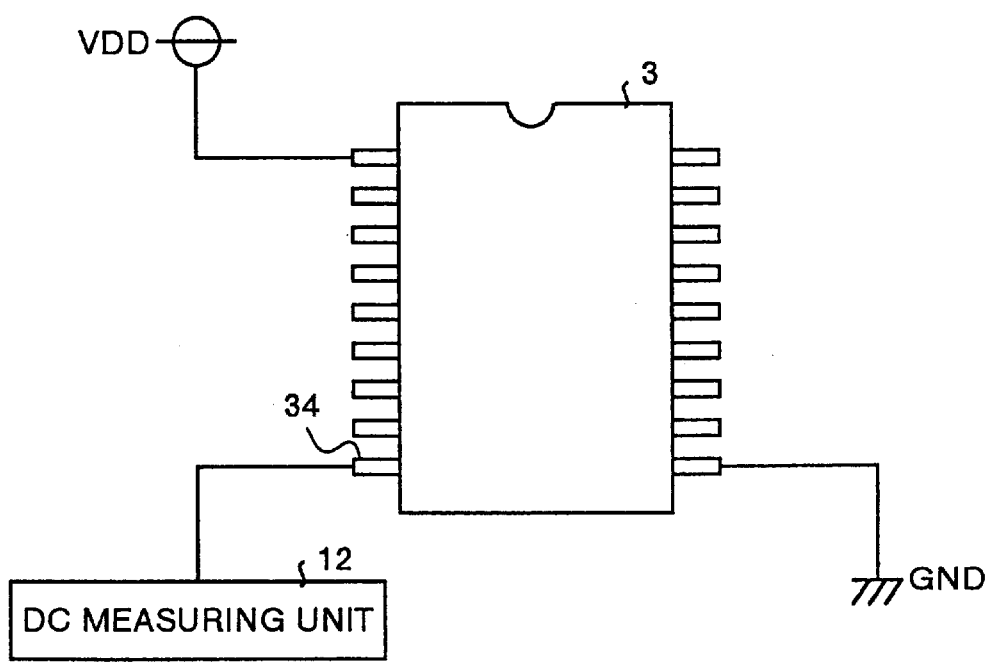
FIG. 2 is a simulated view showing an example of the connection between the LSI and a LSI tester for a DC testing.

FIG. 2 is a simulated view showing an example of connection between the LSI 3 and the DC measuring unit 12 (namely, the LSI tester) for DC testing, and when the DC test is performed, as shown in the figure, the DC test pin 34 in the LSI 3 is connected to the DC measuring unit 12, and a power unit terminal and a ground terminal in the LSI 3 are connected to the power unit VDD and the ground GND respectively.

Figure 3:
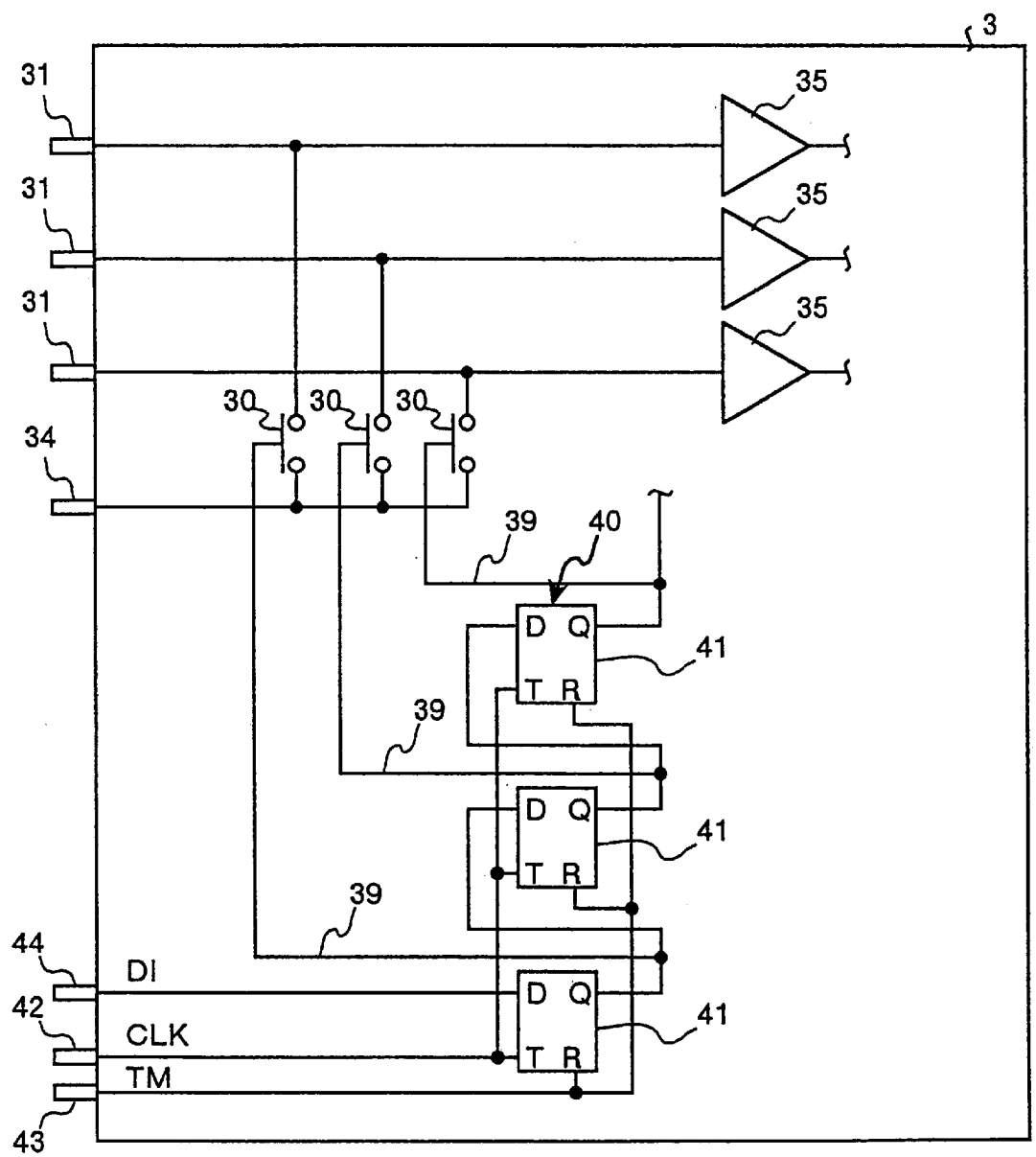
FIG. 3 is a simulated view showing an example of a signal generating circuit for generating signals for opening and closing a switch of the LSI.

FIG. 3 is a simulated view showing an example of a signal generating circuit for generating an open/close signal for the switch 30, in which only three input pins 31 are shown as signal pins as objects for the DC test to avoid the figure becoming complicated, and the input pins, output pins and input/output pins other than the pins are omitted herein. In the figure, the signal generating circuit comprises D flip-flops 41 provided in correspondence to the switches 30 respectively. Each of the D flip-flops 41 has a D terminal, a T terminal and a R terminal as three input terminals, and also has a Q terminal as an output terminal. The T terminal and R terminal in each of the D flip-flops 41 are connected to an input pin 42 for a clock signal CLK and an input pin 43 for a control signal TM respectively, and a clock signal CLK and a control signal TM are input thereto from the outside, for example, from the LSI tester.

Any one of D terminals of a plurality of D flip-flops 41 is connected to an input pin 44 for a data signal DI, and a data signal DI is input thereto from the outside, for example, from the LSI tester. The Q terminal of the D flip-flop 41 connected to the input pin 44 is further connected to the D terminal in one of the other D flip-flops 41. Then, excluding the D flip-flop 41 connected to the input pin 44, the Q terminal in each of the D flip-flops 41 is connected to the D terminal in one of the other D flip-flops 41, which constitutes a shift register 40. Each signal outputted from the Q terminal in each of D flip-flops is supplied to each signal line 39 connected to each of the Q terminals as an open/close signal respectively.

When the DC test is to be performed, assuming that a control signal TM is set to "1" and a data signal DI is set to, for example, serial data of "1000 . . . ", this data signal DI is successively shifted and input to the D flip-flop 41 provided in the down stream side according to input of a clock signal CLK, through which the switches 30 are turned ON one by one.

The switch 30 is in an OFF state when output from the Q terminal in the D flip-flop 41 is "0", and is in an ON state when output from the Q terminal is "1".

During the time when the DC test is not performed, by setting the TM control signal to "0", output from the Q terminal in each of the D flip-flops 41 is "0", accordingly, all the switches 30 are OFF. Output from the Q terminal in each of the D flip-flops 41 is programmed to be set to "0" at any time when the LSI 3 is in an ordinary operation.

Input pin 42 for a clock signal CLK, input pin 43 for a control signal TM, and the input pin 44 for a data signal DI may be signal pins dedicated for use only when the DC test is performed, or may be combinely used as signal pins for signal transaction with the outside or as signal pins connected to the power unit VDD and the ground GND when the LSI 3 is generally used. When input pins 42, 43 and 44 are combinely used as signal pins with their ordinary use, selectors are provided between those input pins 42, 43 44 and the D flip-flop 41, with which the signal paths connected to the input pins 42, 43 and 44 may be switched on DC testing and on their ordinary use.

Figure 4:
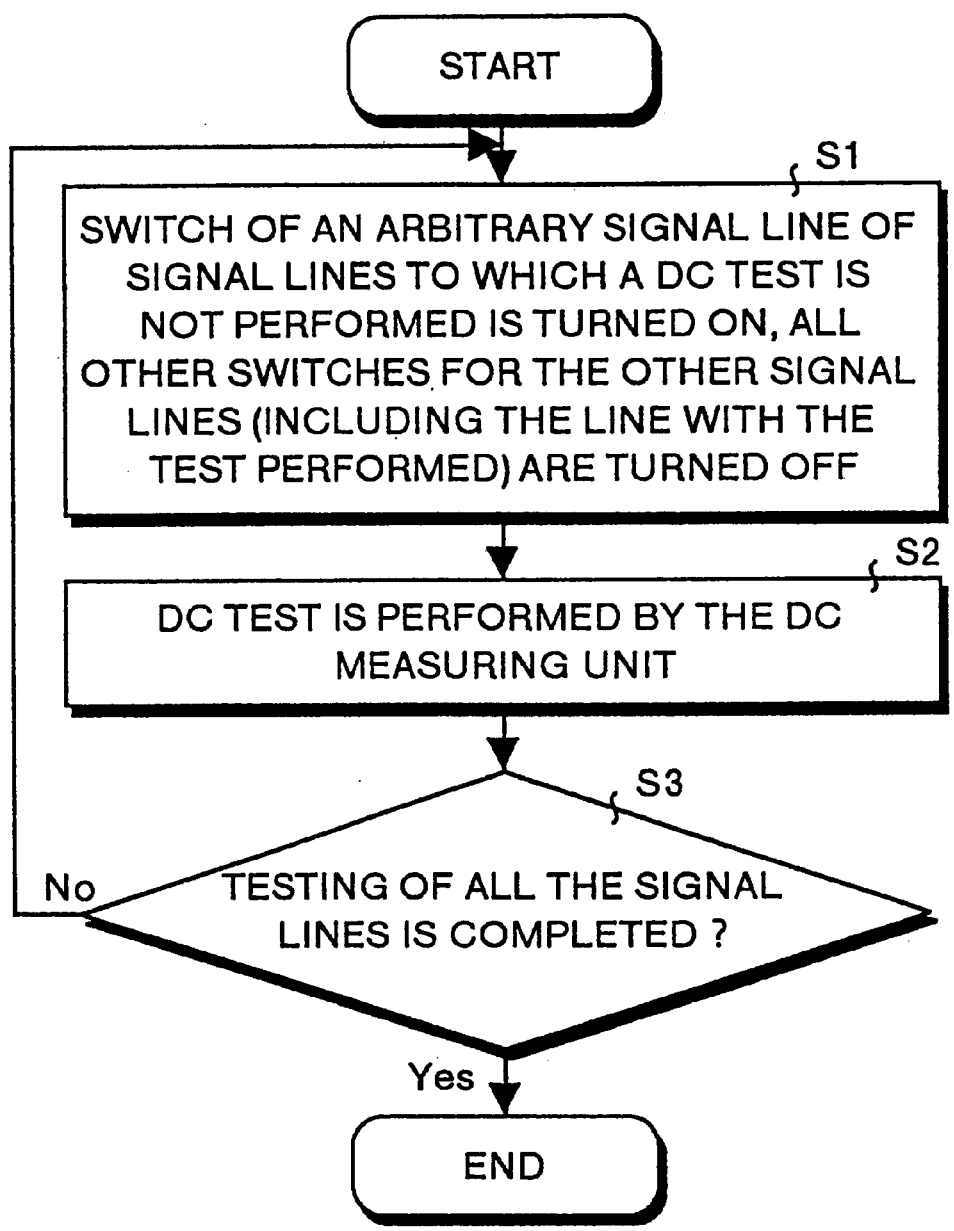
FIG. 4 is a flow chart showing a sequence of executing the DC test according to Embodiment 1.

Next, description is made for effects of Embodiment 1. FIG. 4 is a flow chart showing a sequence when performing the DC test according to Embodiment 1.

At first, the DC test pin 34 in the LSI 3 is connected to the DC measuring unit 12 of the LSI tester, and a power unit terminal and a ground terminal in the LSI 3 are connected to the power unit VDD and the ground GND respectively. Further, the input pins 42, 43 and 44 to which a clock signal CLK, a control signal TM and a data signal DI are input respectively are connected to the outside, for example, to the LSI tester.

Then, a switch 30 for a particular one signal pin, of the signal pins 31, 32 33 as object for the test in the LSI 3, to which the DC test is not executed is turned ON, and the other switches 30 for the signal pins other than this pin are turned OFF (step S1). Then, the DC test is performed with this state kept using the DC measuring unit 12 (step S2). The test is successively and repeatedly performed for all the signal pins as objects for the test (step S3), and the DC test is finished.

With Embodiment 1, the input buffer 35, output buffer 36 and input/output buffer 37 connected to the signal pins 31, 32 and 33 respectively each as an object for the DC test are connected to the single DC test pin 34 through the discretely provided switches 30, all the switches 30 are OFF in the ordinary state, and when the DC test is to be performed, the switches 30 are successively turned ON one by one in a state where the DC test pin 34 is connected to the LSI tester, and therefore it is not necessary that the signal pins 31, 32 and 33 as objects for the test are in one-to-one correspondence with the pin electronics in the LSI tester, and various types of DC test such as a pin contest, an input leak test and an output voltage test can be performed by using a LSI tester having a smaller number of pins than a number of pins in an LSI.

Although the shift register 40 comprising D flip-flops 41 shown in FIG. 3 is used in Embodiment 1 as a circuit for generating open/close signals for the switches 30, in place of the case described above, if the LSI incorporates therein a boundary scan register, output from the boundary scan register may be used as an open/close signal for the switch 30. If the register is mounted therein, there is no need to incorporate flip-flops or the like in the LSI, which allows reduction of the area.

Figure 5:
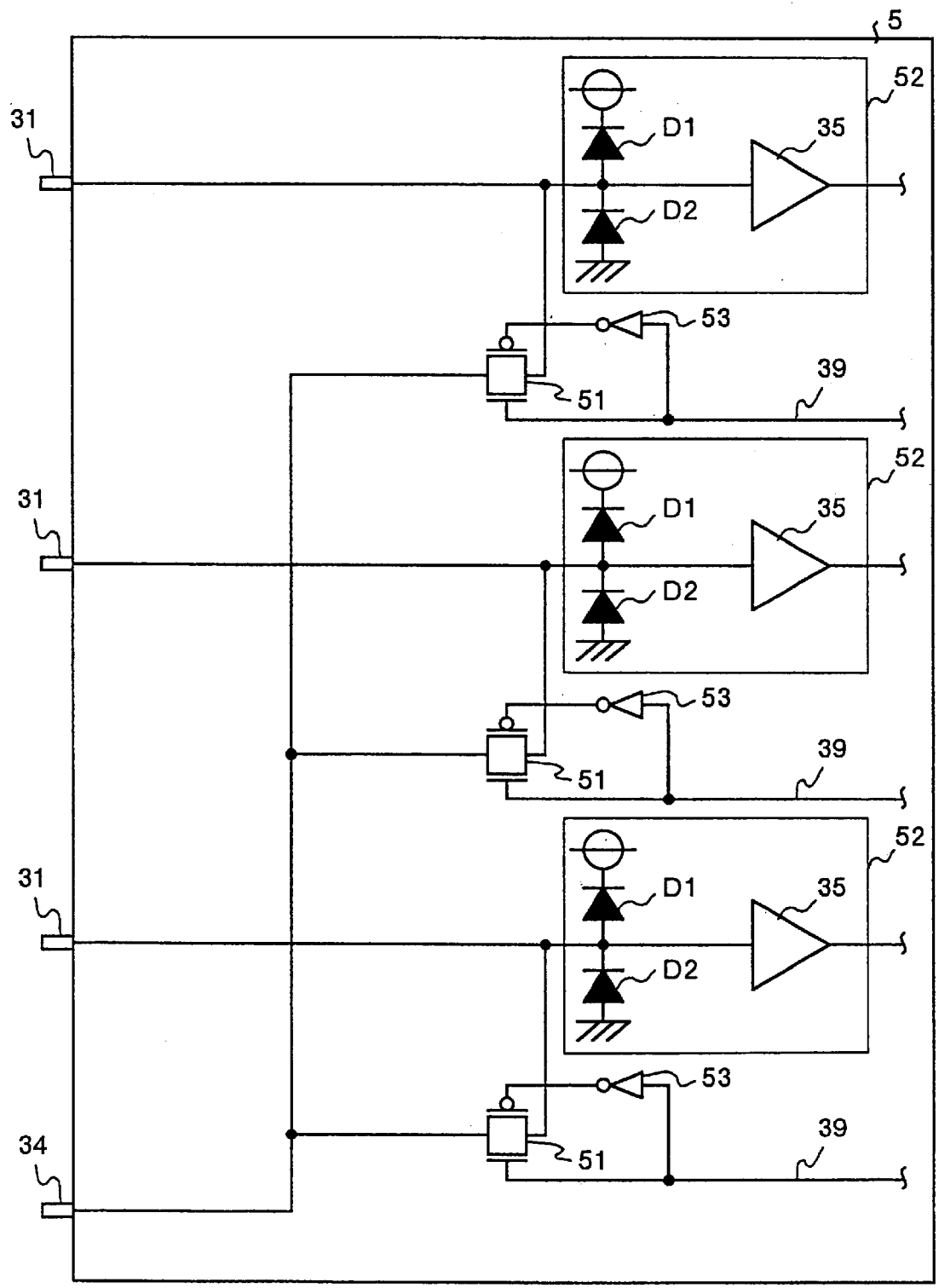
FIG. 5 is a simulated view showing an example of the configuration of the LSI according to Embodiment 2 of the present invention.

FIG. 5 is a simulated view showing an example of configuration of LSI according to Embodiment 2 of the present invention, and to avoid the figure becoming complicated, only three input pins 31 are shown as signal pins as objects for the DC test, and input pins, output pins and input/output pins other than these pins are omitted herein. The LSI 5 in Embodiment 2 uses transfer gates 51 as the switches 30 in Embodiment 1. The same reference numerals are assigned to sections corresponding to those in Embodiment 1, so that description thereof is omitted herein and description of the same effects is also omitted herein.

Figure 12:
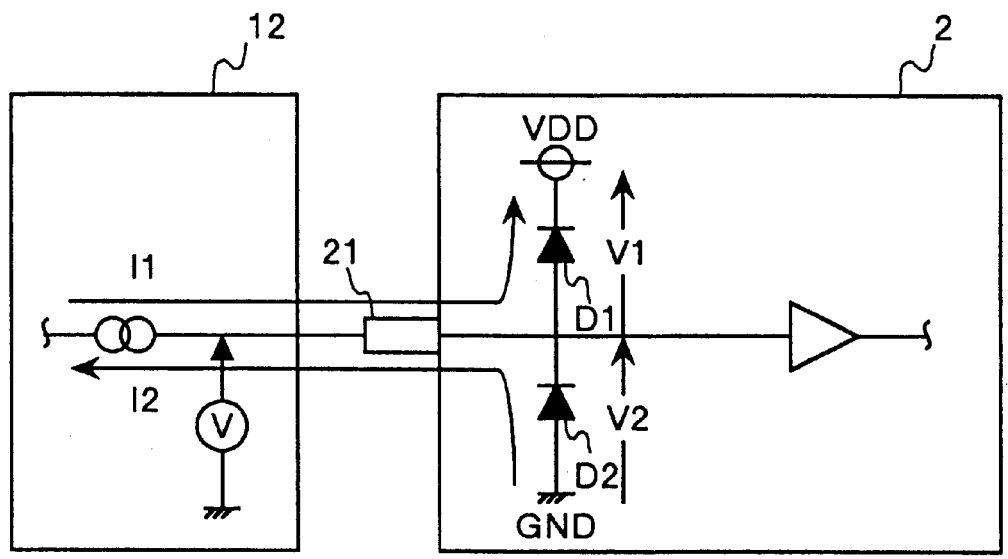
FIG. 12 is a simulated view showing an outline of the pin contest.
Figure 13:
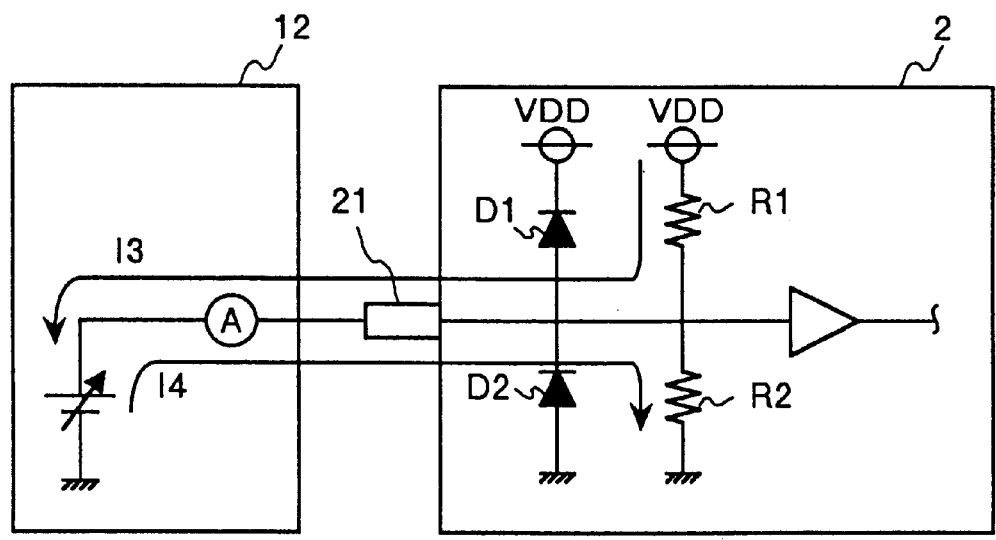
FIG. 13 is a simulated view showing an outline of the input leak test.
Figure 14:
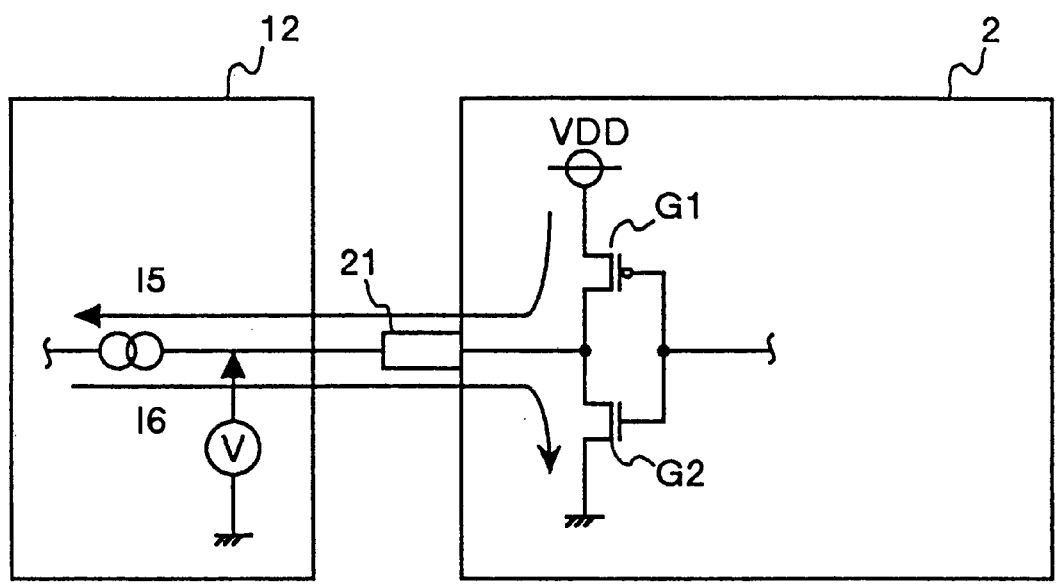
FIG. 14 is a simulated view showing an outline of the output voltage test.

In FIG. 5, the reference numerals D1 and D2 are the same as the protective diodes shown in FIG. 12 to FIG. 14, and those protective diodes D1, D2 and an input buffer 35 constitute an ordinary input circuit 52. The reference numeral 53 in FIG. 5 shows an inverter.

The transfer gate 51 is conducting when an open/close signal is "1", and continuity between a DC test pin 34 and the input circuit 52 is effected. On the other hand, the transfer gate 51 is in a state of a high impedance when the open/close signal is "0", by which the DC test pin 34 is disconnected from the input circuit 52. When the LSI 5 is used in its ordinary state, the open/close signal is set to "0" at any time, and the transfer gate is kept in a high impedance state.

With Embodiment 2, all the transfer gates 51 are generally kept in a high impedance state, and when the DC test is performed, the transfer gates 51 are successively conducting one by one in a state where the DC test pin 34 is connected to the LSI tester, and therefore, the it is not necessary that the signal pins 31 as objects for the test in the LSI 5 are in one-to-one correspondence with the pin electronics in the LSI tester, and various types of DC tests such as a pin contest, an input leak test and an output voltage test can be performed by using a LSI tester having a smaller number of pins than a number of pins in an LSI.

Figure 6:
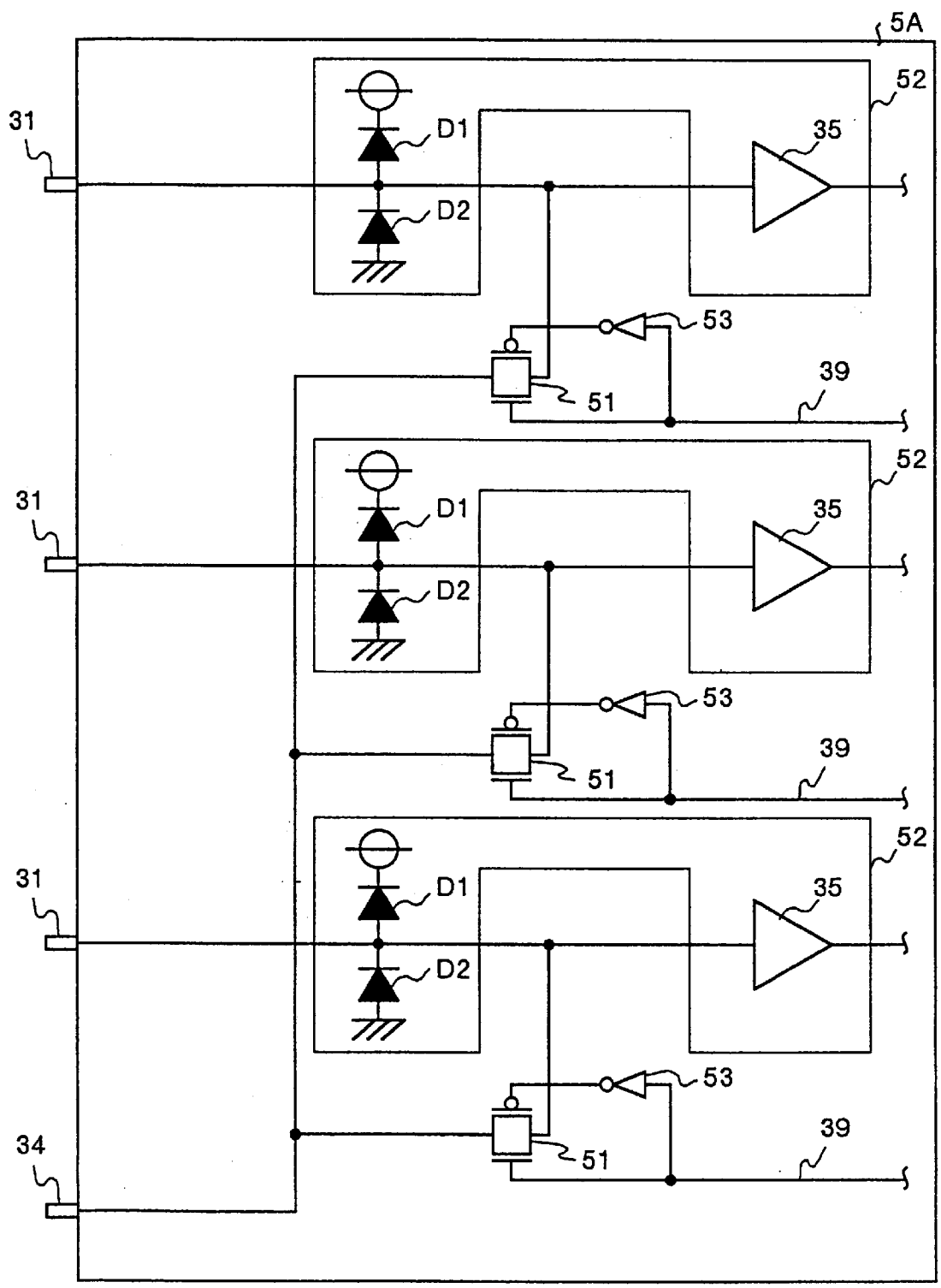
FIG. 6 is a simulated view showing another example of the configuration of the LSI according to Embodiment 2 of the present invention.

Like the LSI 5A shown in FIG. 6 as modification thereto, it is possible to obtain the same effect that various types of DC test such as the pin contest, input leak test and output voltage test can be performed by using the LSI tester having a smaller number of pins than a number of pins in the LSI even if the transfer gate 51 is connected in between the protective diodes D1, D2 and the input buffer 35 in the input circuit 52.

Figure 7:
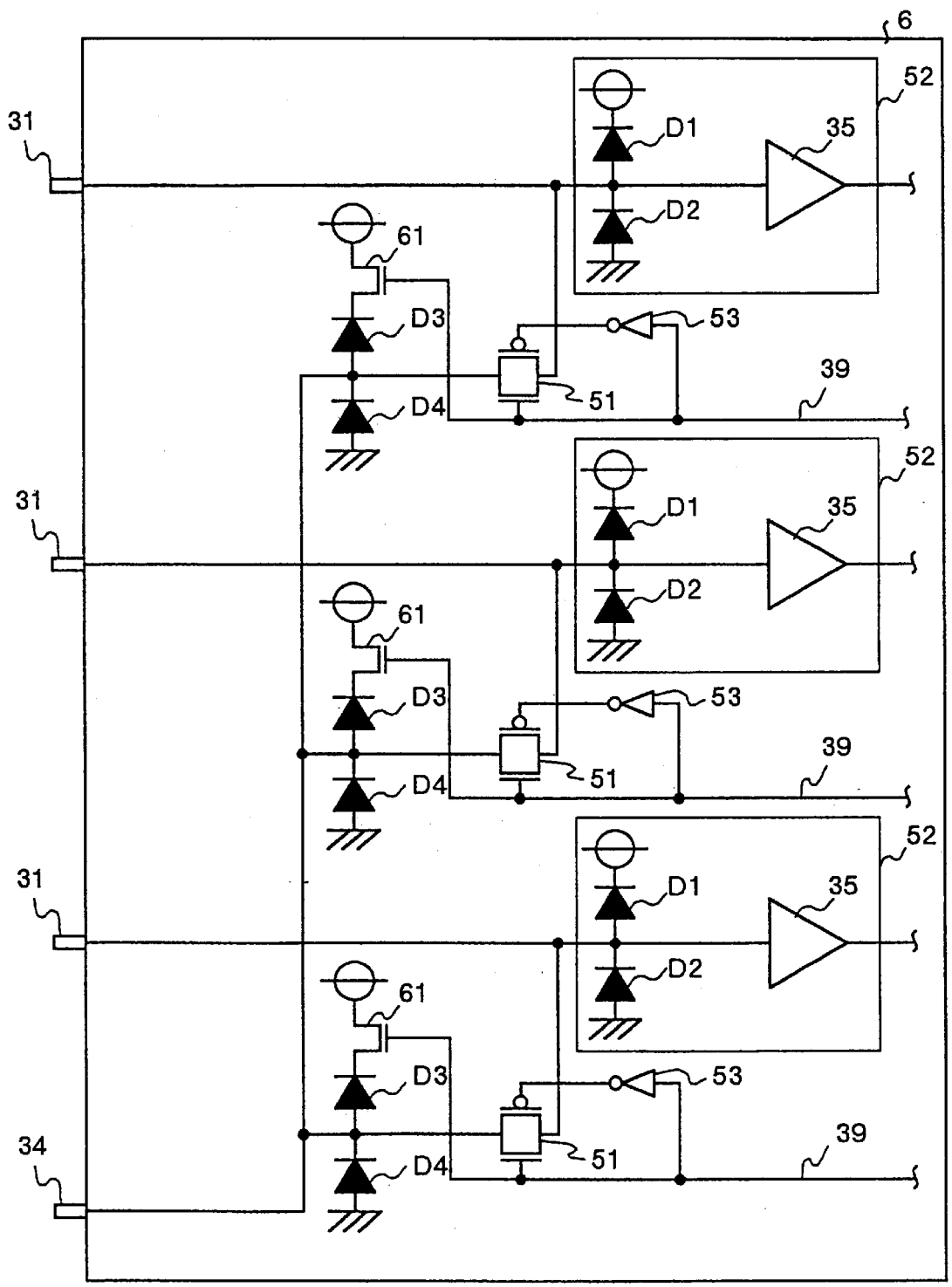
FIG. 7 is a simulated view showing an example of the configuration of the LSI according to Embodiment 3 of the present invention.

FIG. 7 is a simulated view showing an example of configuration of LSI according to Embodiment 3 of the present invention, and to avoid the figure becoming complicated, only three input pins 31 are shown as signal pins as objects for the DC test, and input pins, output pins and input/output pins other than these three pins are omitted herein. The LSI 6 in Embodiment 3 has parasitic diodes D3, D4 formed at the transfer gate 51 in Embodiment 2, and an N-channel transistor 61 is connected in between the parasitic diode D3 in the power unit VDD and the power unit VDD. The same reference numerals are assigned to sections corresponding to those in Embodiment 2, so that description thereof is omitted herein and description of the same effects is also omitted herein.

In a transistor circuit formed with semiconductor bulk crystal it is generally easier to form a parasitic diode at a transfer gate as compared to a transistor circuit having an SOI (silicon on insulator) construction. Therefore, when the LSI 6 is a bulk type of transistor circuit, the N-channel transistor 61 is connected in between the parasitic diode D3 in the power 5 unit VDD and the power unit VDD as shown in FIG. 7.

An open/close signal is provided to the gate of the N-channel transistor 61 from the transfer gate 51, and the gate is ON when the open/close signal is "1", and OFF when it is "0". Accordingly, when the transfer gate 51 is conducting when DC testing, the N-channel transistor 61 connected to the conducting transfer gate 51 is turned ON, by which a current path with the diodes D3 and D4 parasitic to the signal path to which the DC test is executed is shut down.

With Embodiment 3, all the transfer gates 51 are generally kept in a high impedance state, and when the DC test is performed, the transfer gates 51 are successively conducting one by one in a state where the DC test pin 34 is connected to the LSI tester, and therefore it is not necessary that the signal pins 31 as objects for the test in the LSI 6 are in one-to-one correspondence with the pin electronics in the LSI tester, and various types of DC test such as a pin contest, an input leak test and an output voltage test can be performed by using a LSI tester having a smaller number of pins than a number of pins in an LSI.

Figure 8:
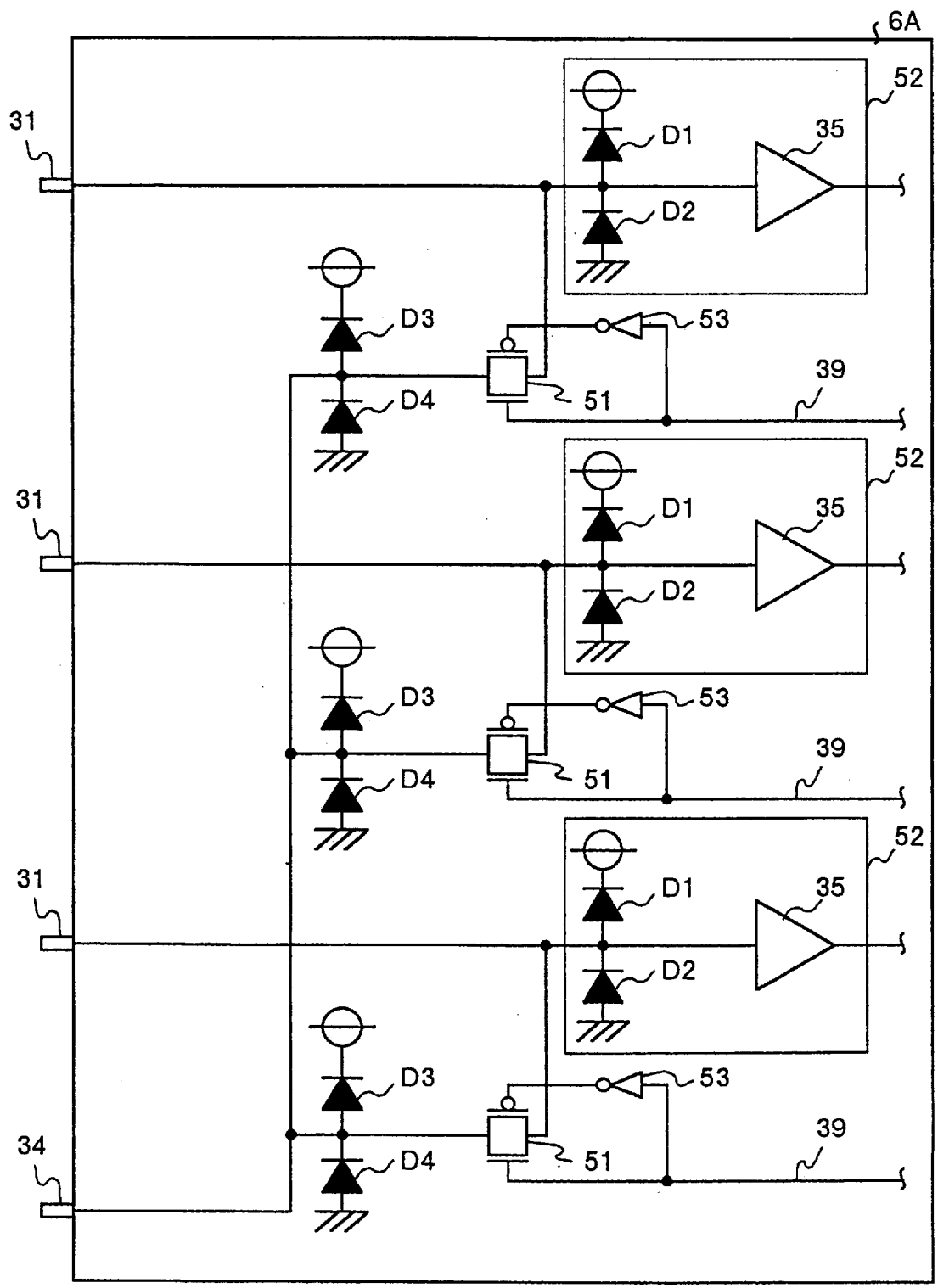
FIG. 8 is a simulated view showing an example of comparison with Embodiment 3.

When the N-channel transistor 61 is not connected to the parasitic diodes D3, D4 like the LSI 6A shown in FIG. 8, the current path with the parasitic diodes D3, D4 is not cut off while DC testing, so that the parasitic diodes D3, D4 operate like the protective diodes D1, D2 in the input circuit 52, and therefore there occurs inconvenience that the pin contest can not discretely executed for each input pin 31.

Figure 9:
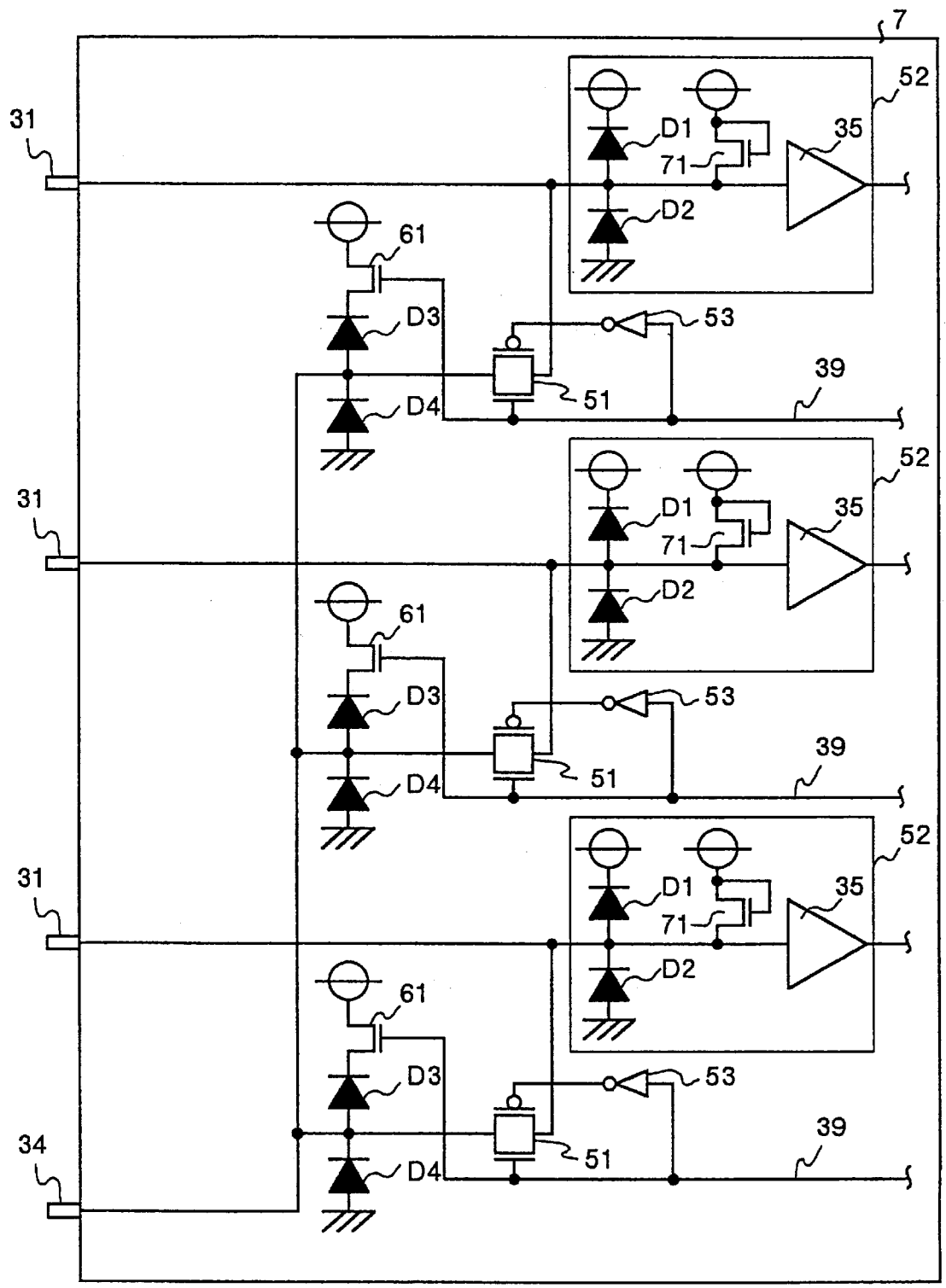
FIG. 9 is a simulated view showing an example of the configuration of the LSI according to Embodiment 4 of the present invention.

FIG. 9 is a simulated view showing an example of configuration of LSI according to Embodiment 4 of the present invention, and to avoid the figure becoming complicated, only three input pins 31 are shown as signal pins as objects for the DC test, and input pins, output pins and input/output pins other than these three pins are omitted herein. The LSI 7 in Embodiment 4 has pull-up resistors 71 each connected to a signal line between the protective diodes D1, D2 and the input buffer 35 in Embodiment 3. The same reference numerals are assigned to sections corresponding to those in Embodiment 3, so that description thereof is omitted herein and description of the same effects is also omitted herein.

With Embodiment 4, all the transfer gates 51 are generally kept in a high impedance state, and when the DC test is performed, the transfer gates 51 are successively conducting one by one in a state where the DC test pin 34 is connected to the LSI tester, and therefore it is not necessary that the signal pins 31 as objects for the test in the LSI 7 are in one-to-one correspondence with the pin electronics in the LSI tester, and various types of DC test such as a pin contest, an input leak test and an output voltage test can be performed by using a LSI tester having a smaller number of pins than a number of pins in an LSI.

Although not shown in the figure, it is possible to obtain the same effect that various types of DC test such as the pin contest, input leak test and output voltage test can be performed by using the LSI tester having a smaller number of pins than a number of pins in the LSI even when a pull-down resistor in place of the pull-up resistor 71 is connected to a signal line between the protective diodes D1, D2 and the input buffer 35.

Figure 10:
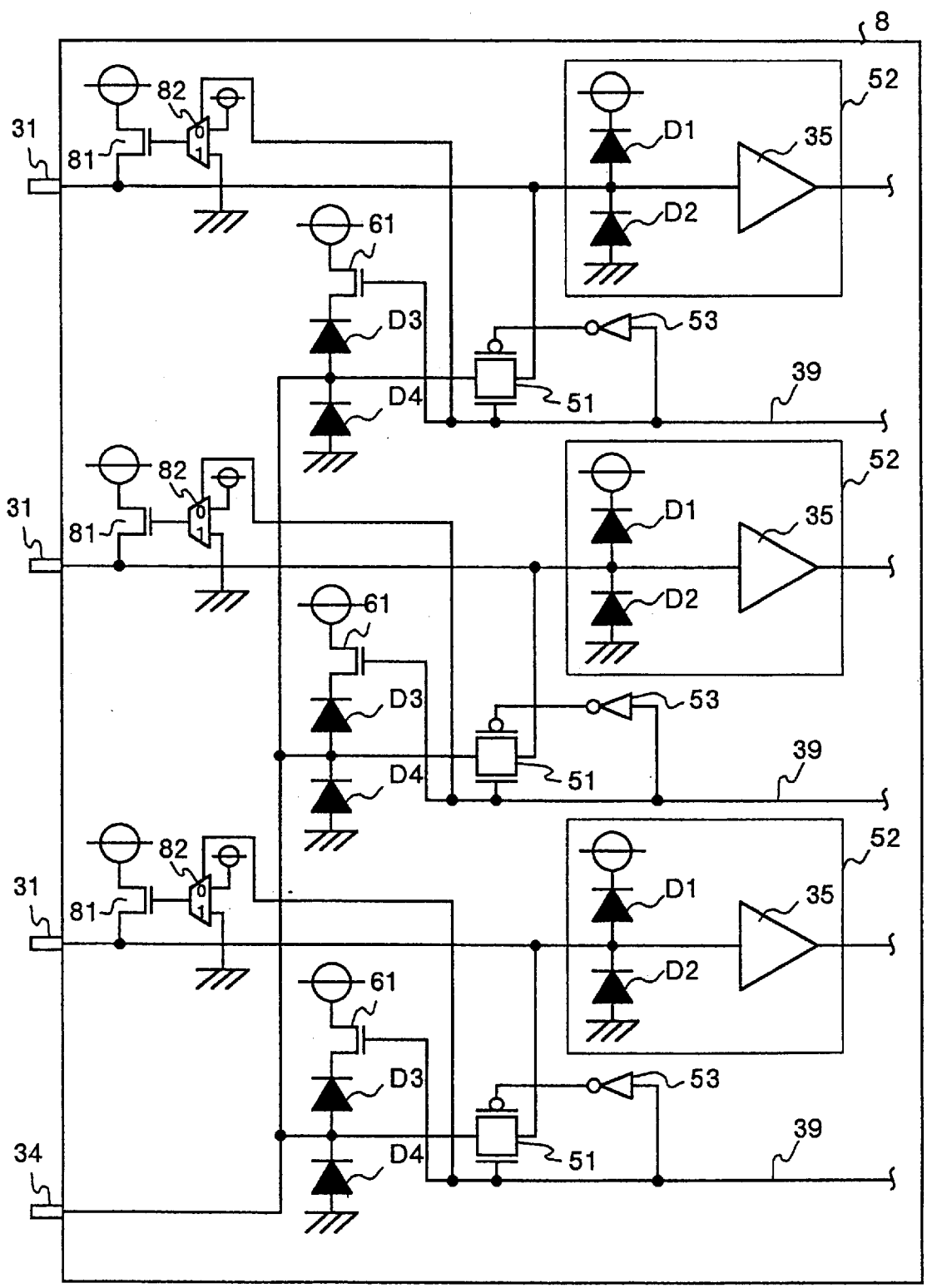
FIG. 10 is a simulated view showing an example of the configuration of the LSI according to Embodiment 5 of the present invention.
Figure 11:
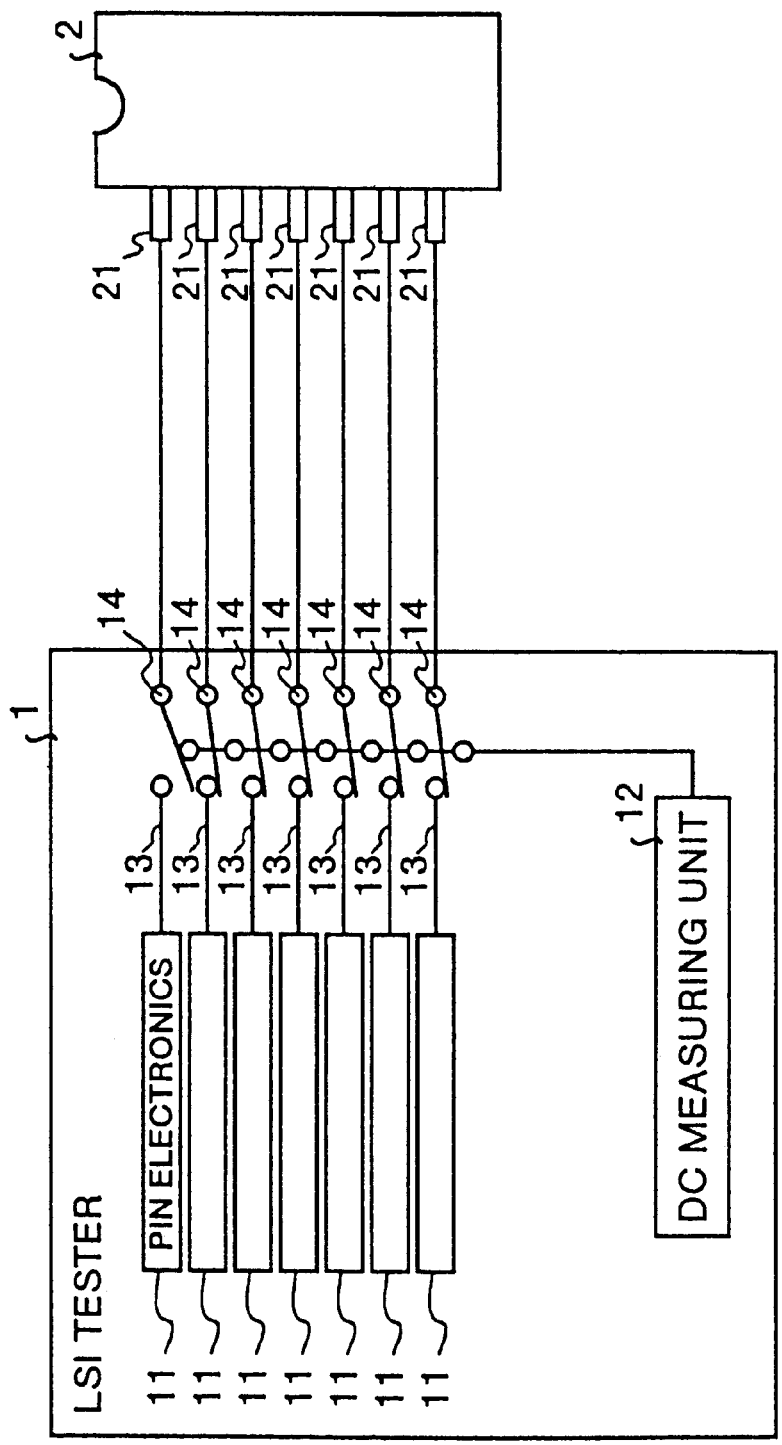
FIG. 11 is a simulated view showing a connectional relation between a LSI and a LSI tester based on the conventional technology.

FIG. 10 is a simulated view showing an example of configuration of LSI according to Embodiment 5 of the present invention, and to avoid the figure becoming complicated, only three input pins 31 are shown as signal pins as objects for the DC test, and input pins, output pins and input/output pins other than these three pins are omitted herein. The LSI 8 in Embodiment 5 has pull-up resistors 81 each connected to a signal line between the protection diodes D1, D2 and the input buffer 35 in Embodiment 3, and selectors 82 are provided so that each selector can provide controls for a state of each pull-up resistor 81 to be at high impedance. The same reference numerals are assigned to sections corresponding to those in Embodiment 3, so that description thereof is omitted herein and description of the same effects is also omitted herein.

Next, description is made for effects of the selector 82. In the selector 82, when the DC test is not performed, output from the selector is "1" when the open/close signal 39 is "0", and the pull-up resistor 81 functions as an element having a specific resistance value. When the DC test is performed, output from the selector is "0" when the open/close signal 39 is "1", and the pull-up resistor 81 is in a state of high impedance, which allows electric connection with the input pin 31 to be disconnected.

With Embodiment 5, all the transfer gates 51 are generally kept in a high impedance state, and when the DC test is performed, the transfer gates 51 are successively conducting one by one in a state where the DC test pin 34 is connected to the LSI tester, and therefore it is not necessary that the signal pins 31 as objects for the test in the LSI 8 are in one-to-one correspondence with the pin electronics in the LSI tester, and various types of DC test such as a pin contest, an input leak test and an output voltage test can be performed by using a LSI tester having a smaller number of pins than a number of pins in an LSI.

The present invention described above can be modified in various ways. For example, the switch 30 is not limited to be the transfer gate 51, and a control signal TM and a data signal DI input into the shift register 40 may be generated inside the LSI to be supplied to the shift register, further, the circuit for generating open/close signal for the switch 30 is not limited to be the shift register 40 comprising D flip-flops 41.

As described above, with the present invention, an LSI to which a DC test is performed by a tester connected to the outside thereof has a plurality of switches successively becoming ON at the time of DC testing in signal paths between plurality of internal circuits for signal input/output and a signal pin for a DC test respectively, and by turning ON each switch, the plurality of internal circuits are successively connected to the signal pin for a DC test one by one when the DC test is performed, so that only by providing one piece to several pieces of DC test pin in at least the LSI, the DC test can be performed, and therefore a DC test can be performed by using an LSI tester having a smaller number of pins than a number of signal pins in the LSI.

With the present invention, an internal circuit comprises protective diodes and an input buffer circuit or an output buffer circuit connected thereto, so that a DC test can be performed to the protective diodes as well as to the input/output buffer circuits.

With the present invention, a switch comprises a transfer gate, so that the switch can be integrated together with various internal circuits of the LSI.

With the present invention, a register is incorporated therein as a circuit for generating signals for successively turning ON the switches, and the register shifts an ON signal of the switch and successively outputs to each of the switches, so that each of the switches can successively be turned ON.

With the present invention, a current path with parasitic diodes is cut off by an N-channel transistor when the DC test is performed, so that a DC test can be performed by cutting off the current path with the parasitic diodes when the DC test is performed even if the parasitic diodes are generated.

This application is based on Japanese patent application No. HEI 10-341837 filed in the Japanese Patent Office on Dec. 1, 1998, the entire contents of which are hereby incorporated by reference.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor integrated circuit comprising:

a plurality of signal pins each for executing signal transaction to the outside;

at least one signal pin designated for a DC test, when a DC test among a) a test for checking connection between the signal pins and an external connected tester, b) a test for checking a current leak failure to the signal pins provided for signal input from the outside, and c) a test for checking a voltage level output from the signal pins provided for signal output to the outside is executed, said at least one signal pin connected to the external tester;

a plurality of internal circuits connected to the plurality of signal pins respectively and provided for signal transactions to the outside; and a plurality of switches, each connected between said at least one signal pin designated for the DC test and a signal path between each of the plurality of internal circuits and the respective remaining signal pin, said plurality of switches for successively connecting the plurality of internal circuits to the at least one signal pin designated for the DC test and said plurality of switches being conductive one by one successively when the DC test is performed.

2. A semiconductor integrated circuit according to claim 1;

wherein said internal circuit comprises protection diodes and a buffer circuit for input or output of a signal.

3. A semiconductor integrated circuit according to claim 2; wherein said switch comprises a transfer gate.

4. A semiconductor integrated circuit according to claim 1 incorporating a circuit for generating signals for successively turning ON said switches; wherein this circuit comprises a shift register for shifting signals to turn ON said switches and successively outputting the signals to the switches respectively.

5. A semiconductor integrated circuit according to claim 3; wherein parasitic diodes are formed at said transfer gate, and an N-channel transistor for cutting off a current path with the parasitic diodes on DC testing is provided between said parasitic diodes and a power unit.

6. A semiconductor integrated circuit comprising:

a plurality of first signal pins each for executing signal transaction to the outside of said semiconductor integrated circuit;

a plurality of signal lines connected to said plurality of first signal pins respectively;

a plurality of internal circuits connected to said plurality of signal lines respectively, each internal circuit including at least one of an input buffer receiving a signal from the corresponding signal line and an output buffer providing a signal for the corresponding signal line;

a second signal pin, and a plurality of switches connecting and disconnecting said second signal pin to said plurality of said signal lines respectively.

7. The semiconductor integrated circuit of claim 6, further comprising:

a third signal pin receiving a control signal, and a control circuit connected to said third signal pin, for controlling to turn on and off said plurality of switches on the basis of the control signal.

8. The semiconductor integrated circuit of claim 7, wherein said control circuit including a plurality of flip-flops having outputs connected to said plurality of switches respectively, said plurality of flip-flops forming a shift register.

9. The semiconductor integrated circuit of claim 8, wherein said shift register shifting the control signal receiving from said third signal pin.

10. The semiconductor integrated circuit of claim 7, wherein said control circuit renders said plurality of switches conductive successively the basis of the control signal.

11. The semiconductor integrated circuit of claim 6, said second signal pin is connected to a tester device when a DC test is executed.

12. The semiconductor integrated circuit of claim 6, further comprising:

a plurality of first diodes connected between a first power supply line and said plurality of signal lines, respectively, and a plurality of second diodes connected between a second power supply line and said plurality of signal lines, respectively.

13. The semiconductor integrated circuit of claim 6, further comprising:

a plurality of first diodes each connected between a first power supply line and said second signal pin, and a plurality of second diodes each connected between a second power supply line and said second signal pin.

14. The semiconductor integrated circuit of claim 13, further comprising:

a plurality of transistors provided correspondingly to said plurality of switches, each transistor for cutting off a current path on one of said plurality of first diodes and being conductive simultaneously with the corresponding switch.

* * * * *